United States Patent
Fechner (10) Patent No.: US 9,618,635 B2
(45) Date of Patent: *Apr. 11, 2017

(54) INTEGRATED RADIATION SENSITIVE CIRCUIT

(75) Inventor: Paul S. Fechner, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1201 days.

This patent is subject to a terminal disclaimer.

(21) Appl. No.: 13/529,516

(22) Filed: Jun. 21, 2012

(65) Prior Publication Data

US 2013/0341522 A1    Dec. 26, 2013

(51) Int. Cl.
| | | |
|---|---|---|
| *G01T 1/24* | (2006.01) | |
| *G01T 7/00* | (2006.01) | |
| *G01J 1/44* | (2006.01) | |
| *G01T 1/02* | (2006.01) | |
| *H01L 31/02* | (2006.01) | |
| *H01L 27/11517* | (2017.01) | |

(Continued)

(52) U.S. Cl.
CPC ............... *G01T 7/005* (2013.01); *G01J 1/44* (2013.01); *G01T 1/026* (2013.01); *H01L 27/11517* (2013.01); *H01L 29/788* (2013.01); *H01L 31/02005* (2013.01); *H01L 31/02019* (2013.01); *H01L 31/10* (2013.01); *G01J 1/46* (2013.01); *G01J 5/24* (2013.01); *G01J 5/34* (2013.01); *G01T 1/17* (2013.01); *H01L 21/77* (2013.01); *H01L 27/02* (2013.01); *H01L 27/115* (2013.01); *H01L 27/14* (2013.01); *H01L 27/144* (2013.01); *H01L 29/00* (2013.01); *H01L 31/00* (2013.01); *H01L 31/09* (2013.01); *H01L 31/103* (2013.01); *H01L 31/115* (2013.01)

(58) Field of Classification Search
CPC .. G01T 7/005; G01T 1/026; G01J 1/46; G01J 1/02; G01J 1/44
USPC ............... 250/338.4, 370.01, 370.07, 370.14
See application file for complete search history.

(56) References Cited

U.S. PATENT DOCUMENTS

| | | |
|---|---|---|
| 4,593,384 A | 6/1986 | Kleijne |
| 5,117,457 A | 5/1992 | Comerford et al. |

(Continued)

FOREIGN PATENT DOCUMENTS

KR    2010-0062652    6/2010

OTHER PUBLICATIONS

"In-Chip Anti-Tamper Sensor Technology (ICAT)" 6 pages, Feb. 6, 2009, downloadable from http://web.archive.org/web/20090401000000*/http://accordsol.com/icat.html.

(Continued)

*Primary Examiner* — David Porta
*Assistant Examiner* — Carolyn Igyarto
(74) *Attorney, Agent, or Firm* — Shumaker & Sieffert, P.A.

(57) ABSTRACT

This disclosure is directed to devices, integrated circuits, and methods for sensing radiation. In one example, a device includes an oscillator, configured to deliver a signal via an output at intervals defined by an oscillation frequency, and a counter, connected to the output of the oscillator and configured to count a number of times the comparator delivers the output signal. The oscillator includes a radiation-sensitive cell that applies a resistance. The resistance of the radiation-sensitive cell is configured to vary in response to incident radiation, wherein the oscillation frequency varies based at least in part on the resistance of the radiation-sensitive cell.

14 Claims, 5 Drawing Sheets

(51) Int. Cl.

| | | |
|---|---|---|
| *H01L 29/788* | (2006.01) | |
| *H01L 31/10* | (2006.01) | |
| *G01J 1/46* | (2006.01) | |
| *G01J 5/24* | (2006.01) | |
| *G01J 5/34* | (2006.01) | |
| *G01T 1/17* | (2006.01) | |
| *H01L 21/77* | (2017.01) | |
| *H01L 27/14* | (2006.01) | |
| *H01L 31/09* | (2006.01) | |
| *H01L 31/103* | (2006.01) | |
| *H01L 31/115* | (2006.01) | |
| *H01L 27/115* | (2017.01) | |
| *H01L 27/02* | (2006.01) | |
| *H01L 27/144* | (2006.01) | |
| *H01L 29/00* | (2006.01) | |
| *H01L 31/00* | (2006.01) | |

(56) References Cited

U.S. PATENT DOCUMENTS

| | | |
|---|---|---|
| 5,173,609 A | 12/1992 | Lacoste et al. |
| 5,309,387 A | 5/1994 | Mori |
| 5,389,738 A | 2/1995 | Piosenka et al. |
| 5,596,199 A | 1/1997 | McNulty et al. |
| 5,712,973 A | 1/1998 | Dayan et al. |
| 6,246,970 B1 | 6/2001 | Silverbrook et al. |
| 6,388,574 B1 | 5/2002 | Davis et al. |
| 6,421,213 B1 | 7/2002 | Blyth |
| 6,895,509 B1 | 5/2005 | Clark |
| 7,188,282 B2 | 3/2007 | Walmsley |
| 7,378,705 B2 | 5/2008 | Riekels et al. |
| 7,472,305 B1 | 12/2008 | Hershman et al. |
| 7,498,644 B2 | 3/2009 | Shapiro et al. |
| 7,718,963 B2 | 5/2010 | Seefeldt et al. |
| 7,795,087 B2 | 9/2010 | Roizin et al. |
| 7,800,156 B2 | 9/2010 | Roizin |
| 7,837,110 B1 | 11/2010 | Hess et al. |
| 7,906,805 B2 | 3/2011 | Sadd et al. |
| 7,978,556 B2 | 7/2011 | Macerola et al. |
| 8,575,560 B1 | 11/2013 | Fechner |
| 8,933,412 B2 | 1/2015 | Fechner |
| 2004/0017224 A1 | 1/2004 | Turner et al. |
| 2005/0248675 A1* | 11/2005 | Hashimoto et al. .......... 348/308 |
| 2006/0186342 A1* | 8/2006 | Burger et al. ............ 250/370.01 |
| 2007/0255966 A1 | 11/2007 | Condorelli et al. |
| 2008/0114582 A1 | 5/2008 | Leterrier et al. |
| 2010/0060562 A1* | 3/2010 | Hadwen et al. .............. 345/102 |
| 2010/0090714 A1 | 4/2010 | Van Geloven et al. |
| 2010/0096556 A1 | 4/2010 | Arsalan et al. |
| 2010/0132047 A1 | 5/2010 | Rodriguez et al. |
| 2010/0225380 A1 | 9/2010 | Hsu et al. |
| 2011/0147806 A1 | 6/2011 | Wilson et al. |

OTHER PUBLICATIONS

Office Action from U.S. Appl. No. 13/529,469, dated Dec. 24, 2013, 15 pp.

Response to Office Action mailed Dec. 24, 2013, from U.S. Appl. No. 13/529,469, filed Mar. 24, 2014, 12 pp.

Notice of Allowance from U.S. Appl. No. 13/529,469, mailed May 19, 2014, 8 pp.

Notice of Allowance for U.S. Appl. No. 13/529,556, mailed Jul. 2, 2013, 10 pp.

"In-Chip Anti-Tamper Sensor Technology (ICAT)" 6 pages, downloadable from http://accordsol.com/ICAT.html.

Neve et al., "Memories: A Survey of Their Secure Uses in Smart Cards," 10 pages, Second IEEE International Security in Storage Workshop, Oct. 2003.

Notice of Allowance from U.S. Appl. No. 13/529,469, mailed Sep. 16, 2014, 8 pp.

* cited by examiner

INTEGRATED RADIATION SENSITIVE CIRCUIT

This disclosure relates to radiation sensors, and more particularly, to radiation sensors integrated with electronic systems.

BACKGROUND

In various applications, it is important to sense or measure any of various types of radiation to which a device or product has been exposed. This may be the case in electronic, medical, food safety, and space applications, for example. One application may be for assurance that medical devices or foods have received the correct dose of radiation to ensure that the medical device has been fully sterilized or that all pathogens leading to further degradation have been exterminated from the food. In addition, the ability to accomplish this function with a simple circuit and without the need for a power supply during the time of irradiation minimizes the expense associated with accomplishing this task.

SUMMARY

This disclosure is directed to devices, integrated circuits, and methods for sensing radiation, including for sensing and recording radiation in an electronic system regardless of whether it is powered or unpowered.

In one example, a device includes an oscillator, configured to deliver a signal via an output at intervals defined by an oscillation frequency, and a counter, connected to the output of the oscillator and configured to count a number of times the comparator delivers the output signal. The oscillator includes a radiation-sensitive cell that applies a resistance. The resistance of the radiation-sensitive cell is configured to vary in response to incident radiation, wherein the oscillation frequency varies based at least in part on the resistance of the radiation-sensitive cell.

In another example, an integrated circuit includes an EEPROM cell. The EEPROM cell includes a ground terminal, a cell output terminal, and a floating gate configured to control a resistance between the ground terminal and the cell output terminal. The EEPROM cell is configured to vary the resistance between the ground terminal and the cell output terminal in response to radiation incident on the EEPROM cell, and thereby vary the voltage of the cell output terminal in response to radiation incident on the EEPROM cell. The integrated circuit further includes a MOSFET transistor, a capacitor, a comparator, and a counter. The MOSFET transistor is connected between the cell output terminal and a voltage source terminal. The capacitor is connected between the ground terminal and the cell output terminal in parallel with the EEPROM cell. The comparator includes a first input terminal, a second input terminal, and a comparator output terminal. The first input terminal is connected to the cell output terminal and the second input terminal is connected to a threshold voltage. The comparator is configured to deliver an output signal via the comparator output terminal in response to the voltage of the cell output terminal reaching the threshold voltage. The counter is connected to the comparator output terminal and configured to count a number of times the comparator delivers the output signal. The MOSFET transistor includes a gate terminal that is connected to the comparator output terminal and configured to vary the resistance between the voltage source and the cell output terminal in response to the output signal from the comparator.

In another example, a method includes configuring an oscillator to deliver an output signal at an oscillation frequency that is dependent on a resistance applied by a radiation-sensitive single polysilicon EEPROM cell comprised in the oscillator. The method further includes varying the resistance applied by the radiation-sensitive single polysilicon EEPROM cell in response to radiation incident on the radiation-sensitive single polysilicon EEPROM cell. The method further includes varying the oscillation frequency of the oscillator in response to the varying of the resistance applied by a radiation-sensitive single polysilicon EEPROM cell. The method further includes counting a number of times the oscillator delivers the output signal.

The details of one or more examples are set forth in the accompanying drawings and the description below. Other features, objects, and advantages will be apparent from the description and drawings, and from the claims.

DETAILED DESCRIPTION

Some of the examples described in the disclosure may be directed to devices, integrated circuits, and methods for a radiation sensor. In various examples, a radiation sensor as described herein may be implemented entirely in complementary metal-oxide-semiconductor (CMOS) circuitry that may be incorporated in any CMOS integrated circuit. In various examples, an integrated radiation sensor as described herein may sense and record the incidence of one or more selected types of radiation on an integrated circuit at all times, whether or not the integrated circuit is powered. In various examples, an integrated circuit incorporating an integrated radiation sensor as described herein, when it is powered up or at any time thereafter, may automatically detect the recorded incidence of radiation as indicated by the radiation sensor, and perform a selected action in response to the recorded incidence of radiation as indicated by the radiation sensor. For example, in various implementations, the integrated circuit may respond to a certain recorded incidence of radiation by the integrated radiation sensor by providing a signal indicating whether or not the integrated circuit has been exposed to more than a selected dose of radiation. A radiation sensor may be implemented as a portion of a larger integrated circuit, and may therefore be implemented with small size, low mass, and low cost, in various examples.

Figure 1:
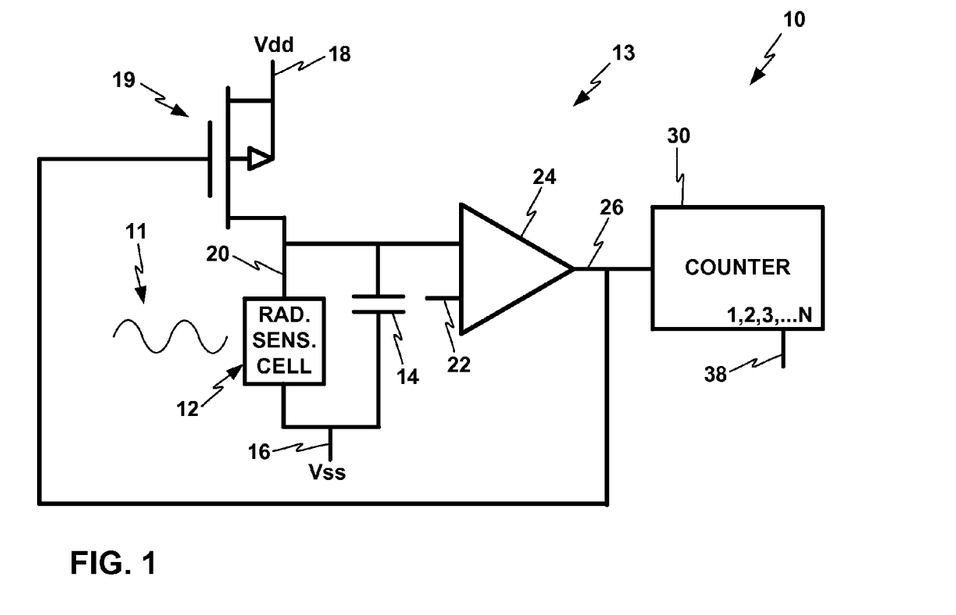
FIG. 1 is a circuit diagram of an illustrative example of a radiation sensor device of this disclosure.

FIG. 1 is a circuit diagram of an illustrative example of a radiation sensor device 10 of this disclosure. Radiation sensor device 10 includes a radiation sensitive cell 12. Radiation sensitive cell 12 may be sensitive to any one or more of a variety of types, frequencies, energies, or wavelengths of radiation, such as example incident radiation wave 11. Radiation sensitive cell 12 may have or be set to an initial electrical resistance, and may vary in resistance in response to radiation 11 incident on radiation sensitive cell 12, for radiation of an energy to which radiation sensitive cell 12 is sensitive. Radiation sensitive cell 12 may vary in resistance cumulatively in response to incident radiation in that radiation sensitive cell 12 varies in resistance proportionally to the amount of radiation that strikes radiation sensitive cell 12, for at least a certain amount of radiation and over at least a certain range of resistance.

For example, radiation sensitive cell 12 may be set to an initial resistance, and then, if radiation sensitive cell 12 is exposed to a first dose of radiation, its resistance may change to a second value of resistance. If radiation sensitive cell 12 is later exposed to a second dose of radiation, its resistance may change to a third value of resistance. If one of the doses of radiation has a longer duration or higher intensity, or otherwise has a higher total energy, the resistance of radiation sensitive cell 12 may change by a proportionally greater amount. The rate of change of resistance of radiation sensitive cell 12 in response to incident radiation is not necessarily the same across its entire range of variability, i.e., the rate of change of resistance may increase or decrease in response to the same dose of radiation depending on where in the range of variability the resistance is, in some examples.

Radiation sensitive cell 12 may be sensitive to any one or more of a variety of types, frequencies, energies, or wavelengths of radiation. For example, radiation sensitive cell 12 may be sensitive to electromagnetic (EM) radiation having energies of approximately 1.1 electron-volts (eV) or higher, i.e., wavelengths of approximately 1.1 microns or less, i.e., mid-near-infrared wavelengths or shorter, with shorter wavelength radiation including ultraviolet, X-ray, or gamma ray wavelengths. In other examples, radiation sensitive cell 12 may be sensitive to electromagnetic (EM) radiation having energies of approximately 1.6 electron-volts (eV) or higher, i.e., wavelengths of approximately 750 nanometers or less, i.e., visible wavelengths or shorter, with shorter wavelength radiation including ultraviolet, X-ray, or gamma ray wavelengths. In other examples, radiation sensitive cell 12 is not sensitive to visible wavelengths but is sensitive to EM radiation of ultraviolet or higher energies, i.e., approximately 3.3 eV or higher. In still other examples, radiation sensitive cell 12 may be sensitive only to EM radiation of X-ray or higher energy, i.e., approximately 120 eV or higher; or only to EM radiation of hard X-ray or higher energy, i.e., approximately 12 kilo-electron-volts (keV) or higher. In still other examples, radiation sensitive cell 12 may be selectively sensitive to certain bounded ranges of wavelengths, such as only visible wavelengths or only near-infrared, visible, and ultraviolet wavelengths, but not to radiation having wavelengths shorter or longer than within that range. In still other examples, radiation sensitive cell 12 may be sensitive to any other range or combination of ranges of wavelengths. Radiation sensitive cell 12 may or may not also be sensitive to other types of radiation besides electromagnetic, such as cosmic rays, for example.

Radiation sensor device 10 also includes a ground terminal 16 and a cell output terminal 20 both connected to the radiation sensitive cell 12, in the example of FIG. 1. Cell output terminal 20 may be configured to vary in voltage in response to the resistance of the radiation sensitive cell 12. In particular, cell output terminal 20 may be connected to source voltage terminal 18 through a MOSFET transistor 19, and in particular, through the source and drain terminals of MOSFET transistor 19. Radiation sensor device 10 further includes capacitor 14 and comparator 24 which, together with radiation sensitive cell 12 and MOSFET transistor 19, form an oscillator 13.

In particular, capacitor 14 may also be connected between the ground terminal 16 and the cell output terminal 20 in parallel with the radiation sensitive cell 12. Cell output terminal 20 is also connected to a comparator 24. Comparator 24 includes a first input terminal connected to cell output terminal 20, a second input terminal 22, and a comparator output terminal 26. The second input terminal 22 is connected to a threshold voltage, so that the comparator 24 is configured to deliver an output signal via the comparator output terminal 26 in response to the voltage of the cell output terminal 20 reaching the threshold voltage on second input terminal 22.

The gate terminal of MOSFET transistor 19 is also connected to the comparator output terminal 26. The MOSFET transistor 19 is thereby configured to vary the resistance between source voltage terminal 18 and cell output terminal 20 in response to the output signal from comparator 24. This completes a feedback system that configures MOSFET transistor 19, radiation sensitive cell 12, capacitor 14, and comparator 24, together with their connections to each other and to source voltage terminal 18 and ground terminal 16 as shown in FIG. 1, to act as an oscillator 13.

In particular, when radiation sensor device 10 is initially powered up and the source voltage at source voltage terminal 18 is initially set to the source voltage Vdd, the gate terminal of MOSFET transistor 19 is at a low voltage, so MOSFET transistor 19 applies a low resistance between source voltage terminal 18 and cell output terminal 20. With this low-resistance connection between source voltage terminal 18 and cell output terminal 20, the voltage of cell output terminal 20 rises toward the source voltage. Radiation sensitive cell 12 applies a given initial resistance, and as the voltage of cell output terminal 20 increases, capacitor 14 accumulates charge. The voltage of cell output terminal 20 increases as the charge on capacitor 14 increases, and after a time, the rising voltage of cell output terminal 20 reaches the same voltage as the threshold voltage on second input terminal 22.

The voltage of cell output terminal 20 reaching the same voltage as the threshold voltage on second input terminal 22 trips the comparator 24, i.e., induces the comparator 24 to deliver the output signal via comparator output terminal 26. The output signal may include a rise in voltage on comparator output terminal 26, which is applied via the gate terminal of MOSFET transistor 19, thereby raising the resistance of MOSFET transistor 19. This isolates cell output terminal 20 from the source voltage on source voltage terminal 18, and enables the charge that has accumulated on capacitor 14 to dissipate through radiation sensitive cell 12 to the ground terminal 16. The voltage on cell output terminal 20 decreases below the threshold voltage on second input terminal 22, which may induce the comparator 24 to stop delivering the output signal via comparator output terminal 26. This may thereby induce a decrease in voltage on the gate terminal of MOSFET transistor 19. As the voltage on the gate terminal of MOSFET transistor 19 decreases, the resistance of MOSFET transistor 19 also decreases, and the source voltage from source voltage terminal 18 once again has a low-resistance connection to cell output terminal 20. The voltage on cell output terminal 20 once again increases. The process thereby begins to repeat itself, with capacitor 14 accumulating charge as the voltage of cell output terminal 20 increases.

The various elements described above that make up oscillator 13 therefore configure the voltage on cell output terminal 20 to oscillate. This oscillation drives the comparator 24 to deliver the output signal on comparator output terminal 26 at regular, periodic intervals defined by an oscillation frequency of the oscillator 13. Radiation sensor device 10 thereby includes an oscillator 13 configured to deliver an output signal, i.e. the comparator output signal, via oscillator output terminal 26 at intervals defined by the oscillation frequency of the oscillator 13, in the example of FIG. 1.

In the example of FIG. 1, source voltage terminal 18 is labeled "Vdd" and ground voltage terminal 16 is labeled "Vss" in keeping with standard CMOS convention, though radiation sensor device 10 may also be implemented in non-CMOS technologies. Ground voltage terminal 16 is not necessarily at ground, but may be at a lower voltage than source voltage terminal 18. In other examples, ground voltage terminal 16 and source voltage terminal 18 may also be reversed.

Radiation sensor device 10 also includes a counter 30, connected to the oscillator output terminal and configured to count the number of times the comparator 24 delivers the output signal, i.e., how many times the oscillator 13 delivers the output signal, where the output signal may be attributed at a specific level to the comparator 24 itself, or at a more general level, to oscillator 13. Counter 30 may be able to maintain and store a cumulative count of how many times the oscillator 13 has delivered the output signal. Counter 30 may have a limit to how high of a cumulative count it may go up to, defined by its internal memory capacity. Counter 30 may also have a counter output 38, and may be configured to communicate a cumulative count to other components via counter output 38. This may include communicating a cumulative count to additional a separate memory component or data storage component, to resolve any limit on the effective capability to store and maintain a cumulative count of the number of output signals from oscillator 13.

The oscillation frequency of oscillator 13 may be precisely defined by the components of oscillator 13, such that it may track a passage of time during which radiation sensor device 10 is powered up, to high precision. Oscillator 13 may also be configured with the capability to vary its oscillation frequency, as a function of the radiation sensitive cell 12. In particular, oscillator 13 may be configured with the capability to vary its oscillation frequency as a function of the radiation sensitive cell 12 being exposed to incident radiation. Radiation sensitive cell 12 may be configured to vary its resistance, i.e. the resistance it applies between ground terminal 16 and cell output terminal 20, in response to intercepting radiation incident on radiation sensitive cell 12. As the resistance of radiation sensitive cell 12 varies, this also varies both the rate of charge accumulation on capacitor 14 when MOSFET transistor 19 is in its low-resistance state and the rate of charge dissipation from capacitor 14 when MOSFET transistor 19 is in its high-resistance state. In this way, because the resistance of the radiation-sensitive cell 12 is configured to vary in response to incident radiation, the oscillation frequency of oscillator 13 also varies based at least in part on the resistance of the radiation-sensitive cell 12.

Oscillator 13 thereby varies its oscillation rate based on radiation incident on oscillator 13, or in particular, based on radiation incident on radiation-sensitive cell 12. Since counter 30 maintains a count of a number of times oscillator 13 delivers its output signal, radiation sensor device 10 maintains and stores an indication or a record of radiation incident on radiation sensor device 10.

Radiation-sensitive cell 12 may also be configured to vary its resistance based on incidence of radiation regardless of whether radiation sensor device 10 is powered or unpowered when the radiation strikes radiation sensor device 10. That is, radiation sensor device 10 may have an initial oscillation frequency that is known and recorded, and radiation sensor device 10 may be powered down for a period of time. Radiation sensor device 10 may then be exposed to radiation at some point while it is unpowered, such that this incident radiation strikes radiation-sensitive cell 12. Radiation-sensitive cell 12 may vary its resistance in response to this incident radiation. Radiation sensor device 10 may then, at a later point in time, be powered up. This activates oscillator 13, thereby inducing oscillator 13 to provide periodic output signals to counter 30. Because radiation has struck radiation-sensitive cell 12 while radiation sensor device 10 was unpowered, and the resistance of radiation-sensitive cell 12 has varied, the oscillation frequency has also varied, and the counter 30 receives the output signals at a new, varied oscillation frequency, i.e., an oscillation frequency that has changed from the initial oscillation frequency due to the change in resistance of radiation-sensitive cell 12. Counter 30 counts occurrences of the output signal from oscillator 13 at the new oscillation frequency.

In this manner, radiation sensor device 10 indicates that radiation sensor device 10 had been exposed to radiation during the period of time in which it was unpowered. For example, a comparison of the count on counter 30 with an expectation value of the count based on the initial oscillation frequency may reveal that radiation sensor device 10 was exposed to radiation. This comparison may also indicate how much radiation struck radiation sensor device 10. Radiation-sensitive cell 12 may vary its resistance based on how much radiation it intercepts, in a precisely known relation, at least over a certain range of total radiation incidence. This may also configure radiation sensor device 10 to indicate how much radiation it has intercepted, by how much its oscillation frequency has changed, at least over a given range of incident radiation and corresponding range of variation in the oscillation frequency.

While the example above indicates that radiation sensor device 10 may track whether and how much radiation it has intercepted during a period of time in which radiation sensor device 10 is unpowered, radiation sensor device 10 may similarly track its exposure to radiation during periods when it is powered, or when it may be unpowered at one or more times and powered at one or more times. Radiation sensor device 10 may track its exposure to incident radiation regardless of whether it is powered or not.

Radiation sensor device 10 may be incorporated as part of an integrated circuit or other device that reads the count from counter 30 via counter output 38 to determine whether radiation sensor device 10 has been exposed to radiation, and which may perform an action in response to a positive indication that radiation sensor device 10 has been exposed to radiation. For example, this may take the form of providing a signal, such as to indicate how much of a selected type of radiation the circuit has measured. Radiation sensor device 10 may thereby configure the integrated circuit or other device to be measure exposure to a given form of radiation such as to ensure sterilization in a medical or food safety application, as further detailed below.

Radiation sensitive cell 12 may be struck by relatively smaller doses of incident radiation with significant intervals of time in between receiving any radiation, but still persistently retain the changes to its resistance in between doses over significant durations of time, in various examples, and therefore still accurately track exposures to incident radiation over time. In various other examples, the resistance of radiation sensitive cell 12 may also vary over relatively long periods of time due to other effects independent of incident radiation, such as electron tunneling or other electron leakage. Radiation sensor device 10 may include additional circuitry or other means for compensating for or correcting for this additional rate of change in the resistance of radiation sensitive cell 12 over time.

As one example, radiation sensitive cell 12 may have a known rate of decrease of its resistance by 1% per year due to electron tunneling, independent of any exposure to radiation. Radiation sensor device 10 may correct for this, such as by causing a small variation in the threshold voltage on the second input terminal 22 over time to produce an equivalent response profile from the comparator 24 as if radiation sensitive cell 12 had no non-radiation-dependent variation in resistance. Other examples may experience other rates of electron leakage higher or lower than the specific example mentioned above, or other secondary effects. In other examples, radiation sensitive cell 12 may experience no electron tunneling or other effects that induce any changes in the resistance it applies other than exposure to incident radiation of the selected type or range.

Figure 2:
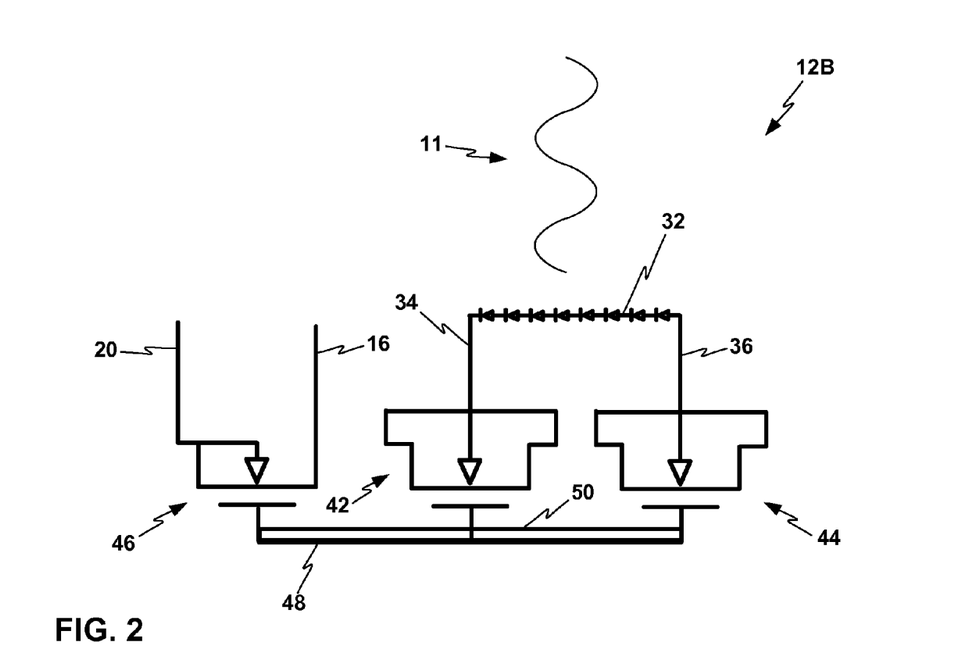
FIG. 2 is a circuit diagram of an illustrative example of a radiation sensitive cell that may be part of a radiation sensor device of this disclosure.

FIG. 2 is a circuit diagram of an illustrative example of a radiation sensitive cell 12B that may be part of a radiation sensor device of this disclosure, such as radiation sensor device 10 of FIG. 1. Radiation sensitive cell 12B may include or be a single-polysilicon Electrically Erasable Programmable Read Only Memory (EEPROM) cell formed as part of a CMOS integrated circuit. In this example, radiation sensitive cell 12B includes a floating gate 48, charging terminals 34 and 36, a ground terminal 16, and a cell output terminal 20. Radiation sensitive cell 12B may also include a metal oxide semiconductor (MOS) tunneling capacitor 42, a MOS control capacitor 44, and a MOS floating gate transistor 46.

Floating gate transistor 46 includes a metal oxide semiconductor field effect transistor (MOSFET), illustratively depicted as an N-channel transistor in this example, and which may be a P-channel transistor in other examples. Floating gate transistor 46 has a "floating gate" because its only electrical connection is through electron tunneling. Radiation sensitive cell 12B may be formed using a polysilicon deposition process to form a single polysilicon layer for the control capacitor 44, the tunneling capacitor 42, and the floating gate transistor 46. Ground terminal 16 and cell output terminal 20 are connected to the MOSFET transistor of floating gate transistor 46.

Charging terminals 34 and 36 are connected between photodiode bank 32, control capacitor 44, and tunneling capacitor 42. Photodiode bank 32 includes a set of photodiodes connected together in series. While a given number of photodiodes are illustrated in the example circuit diagram of FIG. 2, various example photodiode banks may include any number of one or more photodiodes.

Photodiode bank 32 forms a cell charging circuit that charges the tunneling capacitor 42 and the control capacitor 44 when photodiode bank 32 intercepts qualifying radiation 11, i.e., radiation of a type that photodiode bank 32 is configured to be sensitive to. Each photodiode in photodiode bank 32 translates a photon incident on the photodiode into a temporary voltage that temporarily induces an electrical current across the photodiode. With multiple photodiodes connected in series, this voltage response to incoming radiation incident on the individual photodiodes may be superposed together such that each photodiode that receives incident radiation contributes additional voltage to the overall voltage of the photodiode bank 32.

When photodiode bank 32 intercepts radiation 11, it may charge tunneling capacitor 42 and the control capacitor 44 proportionally to the amount or flux of radiation 11 it receives, or in some other relation based on the amount or flux of radiation 11 it receives. The charging of tunneling capacitor 42 and control capacitor 44 based on how much radiation 11 photodiode bank 32 receives may be based on both the intensity of radiation 11 at a given time, and the duration of time for which radiation 11 strikes photodiode bank 32.

For example, this may be based on an integral of total flux of radiation 11 incident on photodiode bank 32 over time, although this may also be modified by additional factors such as differential response by photodiode bank 32 to radiation 11 at the peripheries of the range of sensitivity of photodiode bank 32 to radiation 11, or non-linear effects in the response of photodiode bank 32 to radiation 11, particularly when radiation 11 has a relatively high intensity. Radiation sensitive cell 12B may be designed to mitigate or account for non-linear response factors of photodiode bank 32 to radiation 11, such as by including collimators or filters in the path of radiation 11 before it strikes photodiode bank 32, or including multiple photodiode banks with different response profiles and comparing the responses of different photodiode banks to isolate and resolve any non-linear responses, for example.

By charging tunneling capacitor 42 in response to radiation 11, photodiode bank 32 induces tunneling of charge carriers from tunneling capacitor 42 through insulating layer 50 to floating gate 48. This delivery of charge carriers to floating gate 48 alters the resistance applied by floating gate transistor 46 between ground terminal 16 and cell output terminal 20. In this manner, radiation sensitive cell 12B is configured to vary the resistance between the ground terminal 16 and the cell output terminal 20 in response to radiation 11 incident on the radiation sensitive cell 12B, and in particular, in response to radiation 11 incident on photodiode bank 32 of radiation sensitive cell 12B. Radiation sensitive cell 12B thereby varies the voltage of the cell output terminal 20 in response to radiation 11 incident on radiation sensitive cell 12B.

Additionally, photodiode bank 32 is operable to charge tunneling capacitor 42 and control capacitor 44 and thereby to charge floating gate 48 and to vary the resistance between the ground terminal 16 and the cell output terminal 20 in response to incident radiation 11, regardless of whether radiation sensitive cell 12B. Photodiode bank 32 is operable to generate a voltage between charging terminals 34 and 36 in response to radiation 11 regardless of whether radiation sensitive cell 12B is powered. The energy required for photodiode bank 32 to generate this voltage between charging terminals 34 and 36 is supplied by the incident radiation 11 itself. The energy required for the tunneling of charge carriers from tunneling capacitor 42 to floating gate 48 is similarly supplied by the voltage on charging terminal 34 and thereby also by the incident radiation 11 itself.

Once the charge carriers have tunneled to floating gate 48, they remain there without requiring any energy. Floating gate 48 may continue to accumulate charge due to charging in response to any additional radiation 11, at least over a selected range of capacity for charge accumulation, without requiring any source of energy other than the incident radiation itself, and regardless of whether radiation sensitive cell 12B is powered or unpowered. In this manner, floating gate transistor 46 may continue to vary the resistance it applies between ground terminal 16 and cell output terminal 20 in response to radiation 11 incident on radiation sensitive cell 12B, regardless of whether radiation sensitive cell 12B is powered or unpowered.

During times when radiation sensitive cell 12B is unpowered, radiation sensitive cell 12B varies the resistance of floating gate transistor 46 in response to incident radiation 11 without varying the voltage of the cell output terminal 20, since the voltage of the cell output terminal 20 is also dependent on the voltage difference between source voltage terminal 18 and ground voltage terminal 16, which is dependent on radiation sensitive cell 12B being powered. Since radiation sensitive cell 12B varies the resistance of floating gate transistor 46 in response to incident radiation 11 regardless of whether radiation sensitive cell 12B, though, even when radiation sensitive cell 12B is unpowered, radiation sensitive cell 12B varies the voltage that cell output terminal 20 is going to have after radiation sensitive cell 12B is powered up again.

In other words, radiation sensitive cell 12B effectively stores a latent but inherent value for the voltage that it will apply to cell output terminal 20 once radiation sensitive cell 12B is powered up again, in the form of the resistance of floating gate transistor 46. Even when radiation sensitive cell 12B is unpowered, radiation sensitive cell 12B continues to respond to any incident radiation by varying that latent but inherent stored value for the voltage that it will apply to cell output terminal 20 in the form of the resistance of floating gate transistor 46. Radiation sensitive cell 12B thereby varies the voltage of the cell output terminal 20 in response to radiation 11 incident on radiation sensitive cell 12B, either in a rapid real-time process if radiation sensitive cell 12B is powered at the time, or in a delayed process in which the varied voltage to be applied to the cell output terminal 20 in response to radiation 11 incident on radiation sensitive cell 12B is latently but inherently stored via the resistance of floating gate transistor 46, and then applied to the cell output terminal 20 after radiation sensitive cell 12B is powered up again.

The overall voltage response of the photodiode bank 32 may be designed by selecting different numbers of photodiodes to connect in series, in different examples of radiation sensitive cell 12B. Different examples of radiation sensitive cell 12B may also be designed with different types of photodiodes that have different frequency ranges of radiation in response to which the photodiodes generate a voltage. A designer may also further tailor a desired radiation response profile for photodiode bank 32 by positioning one or more shields, filters, coatings, grids, or collimators over photodiode bank 32, or by using multiple photodiode banks with different response profiles and comparing their results, or any combination of the above, in different examples. Different options for tailoring specific response profiles for the photodiode bank 32 are further detailed below.

As one particular example, a selected photodiode may have a response range of up to a maximum of approximately 0.6 volts generated in response to a certain flux of qualifying radiation, where "qualifying radiation" is used herein to indicate a type of radiation that induces a voltage response in a given photodiode, or other type of radiation sensitive element of a radiation sensitive cell. In other words, "qualifying radiation" is used herein to indicate a type of radiation to which a radiation sensitive element of a radiation sensitive cell is sensitive and responsive. In this example where each photodiode has a maximum response of 0.6 volts it generates in response to a given upper threshold of flux of radiation for its range of response, stacking two such photodiodes in series may superpose the maximum voltage response of the photodiodes, so that together they have a maximum response of 1.2 volts. If the same flux of radiation strikes the area of both of these photodiodes, the same radiation exposure event will generate twice the voltage response. A photodiode bank 32 may include two of these photodiodes for a maximum voltage response of 1.2 volts, or may include ten photodiodes for a maximum voltage response of approximately 6.0 volts, or twenty photodiodes for a maximum voltage response of approximately 12.0 volts, for example.

The number of photodiodes selected in designing a particular photodiode bank 32 may take into account for other properties of radiation sensitive cell 12B, such as the thickness of insulating layer 50 and the charge-carrying capacity of floating gate 48. The thickness of insulating layer 50 may be partly a function of the manufacturing process used to make radiation sensitive cell 12B, which may be a standard CMOS single-polysilicon process, for example. Generally, the thicker the insulating layer 50, the higher the voltage is required to tunnel charge carriers from tunneling capacitor 42 through insulating layer 50 to floating gate 48.

Insulating layer 50 may be formed as a silicon oxide layer by oxidation of a surface of a single polysilicon layer, and the thickness of the silicon oxide layer may be controlled by varying the duration of time or other properties of the process of oxidizing the surface of the single polysilicon layer, in this example. The charge carrying capacity of floating gate 48 may also be constrained in part by the thickness of insulating layer 50, where the higher the thickness of insulating layer 50, the more charge that floating gate 48 may accumulate before its charge storing response becomes non-linear or reaches a maximum due to its own stored charge beginning to enable charge carrier tunneling back through insulating layer 50, for example.

Therefore, increasing the number of photodiodes included in photodiode bank 32 may also increase the thickness of insulating layer 50 and the charge carrying capacity of floating gate 48 that may be used, and therefore also increase the total response range and general performance of radiation sensitive cell 12B, at least within a given range for the potential number of photodiodes. The advantages of a higher number of photodiodes may also be constrained at an upper end by reasonable system voltage levels in radiation sensitive cell 12B, depending on implementation specifics, where different materials, dimensions, or processes being suitable for different upper bounds on voltage.

In various examples, photodiode bank 32 may be manufactured with a silicon-on-insulator (SOI) CMOS process in which each diode is fully isolated by insulator material, which may be an oxide. This may provide advantages such as eliminating parasitic photosensitive elements that may occur in other bulk CMOS processes, for example.

In one particular illustrative example, a designer may opt to form the insulating layer 50 with a high-voltage oxide and a thickness of 60 angstroms. In this case, the photodiode bank may need to have a maximum voltage response of approximately five volts to induce charge carrier tunneling through the insulating layer 50 with a suitable sensitivity to incident radiation 11 on photodiode bank 32, i.e., to have a suitably high rate of charging floating gate 48 in response to incident radiation 11. Since each photodiode in this example contributes approximately 0.6 volts at its maximum response to incident radiation, the designer may opt to include eight or nine photodiodes in photodiode bank 32 to generate a maximum response voltage of approximately five volts at an upper range of flux of the qualifying radiation.

Using different numbers of photodiodes in photodiode bank 32 may cause a different maximum voltage provided to tunneling capacitor 42 and a different rate of charge carrier tunneling through insulating layer 50 in response to the same flux of incident radiation 11. An engineer designing a particular embodiment of radiation sensitive cell 12B may desire a relatively higher voltage and higher response rate in some applications. In different examples, the engineer may conclude that her desired maximum response voltage is ten volts, or twenty volts, for photodiode bank 32. One of these higher response voltage levels may be best suited to generate a stored charge on floating gate 48 quickly and accurately in response to a relatively short yet intense flux of radiation 11, in different applications.

The advantages of more photodiodes and higher voltage for photodiode bank 32 in response time and precision response to short and high intensity radiation flux may also be constrained at an upper range by the materials, dimensions, and processes used in a specific implementation of radiation sensitive cell 12B. In some examples, trying to design a photodiode bank 32 to provide a higher voltage than approximately twenty volts in some examples, may push up against the physical limits of the materials that form radiation sensitive cell 12B, which may for example take the form of risking a dielectric breakdown in insulating layer 50 at the upper end of the voltage response of photodiode bank 32. Various materials, dimensions, and processes may impose different upper limits on the voltage used for radiation sensitive cell 12B, and different criteria for optimizing the desired maximum response voltage between desired response time, desired precision, and the constraints of available materials, dimensions, and processes used for radiation sensitive cell 12B. An engineer may perform optimization analysis to decide on a specific design to implement radiation sensitive cell 12B in a given application.

In the example in which each photodiode stacked in series contributes a maximum response voltage of approximately 0.6 volts, the engineer may then opt to include sixteen or seventeen photodiodes in photodiode bank 32 to configure photodiode bank 32 for a maximum response threshold of approximately ten volts, or the engineer may opt to include thirty-three or thirty-four photodiodes in photodiode bank 32 to configure photodiode bank 32 for a maximum response threshold of approximately twenty volts. In these examples, these specific numbers of photodiodes to include in photodiode bank 32 may advantageously configure radiation sensitive cell 12B for rapid and precise performance, in terms of rapidly inducing a charge on floating gate 48 that reflects with high precision even a relatively short and intense interception of incident radiation 11, and within the physical limits of radiation sensitive cell 12B without risking negative effects at the upper range of voltage response, such as imprecise non-linear response or dielectric breakdown.

Radiation sensitive cell 12B may have an initial resistance on floating gate capacitor at the time of manufacture or at some time thereafter and before deployment. For example, radiation sensitive cell 12B may be manufactured in a number of manufacturing steps, and at or near the end of the manufacturing process, the resistance of radiation sensitive cell 12B may be tested and recorded. The initial resistance may be due in part simply to the structure of floating gate transistor 46, or to a relatively minor charge induced on floating gate 48 by photodiode bank 32 during incidental exposure to radiation such as visible light during the manufacturing process, or to a relatively minor charge on floating gate 48 inherent to its electrostatic response to the structure of the components in its vicinity in radiation sensitive cell 12B or in a larger integrated circuit or other device in which it is incorporated. The initial resistance of radiation sensitive cell 12B may be measured and recorded at or near the end of the manufacturing process, for comparison to later measurements. For example, this may take the form of measuring and recording the oscillation frequency of a radiation sensor device, such as radiation sensor device 10 of FIG. 1, in which radiation sensitive cell 12B is incorporated.

Radiation sensitive cell 12B may then respond to any subsequent incident radiation of a qualifying type on the series-connected photodiodes of photodiode bank 32 by decreasing the resistance between the ground terminal 16 and the cell output terminal 20 from this initial resistance, as previously measured and recorded, to a lower resistance, due to the charging of floating gate 48. That new, lower resistance is then available to be measured and compared to the initial resistance.

Figure 3:
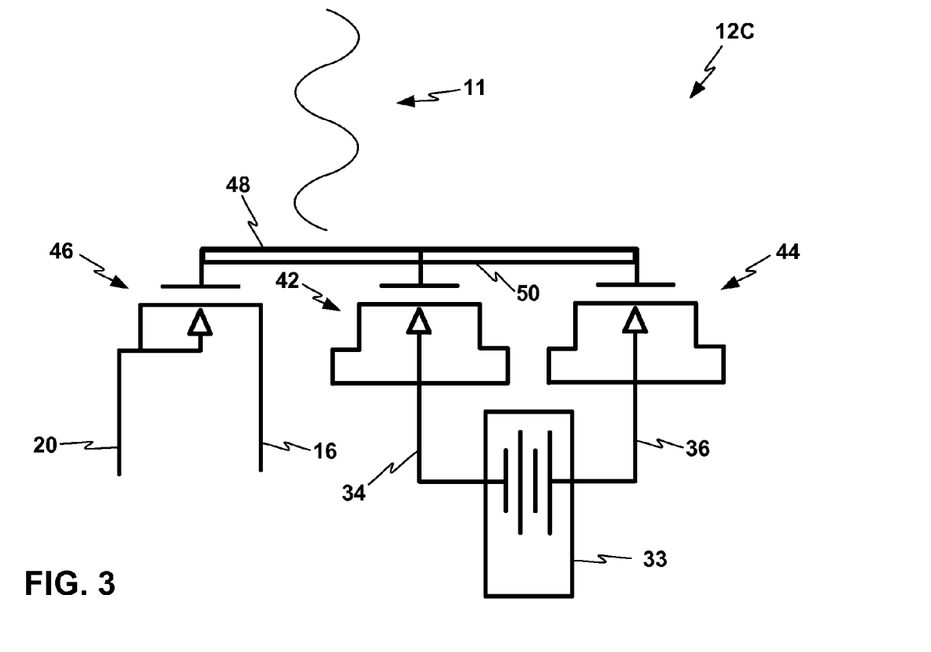
FIG. 3 is a circuit diagram of an illustrative example of a radiation sensitive cell that may be part of a radiation sensor device of this disclosure.

FIG. 3 is a circuit diagram of an illustrative example of another type of radiation sensitive cell 12C that may be part of a radiation sensor device of this disclosure, such as radiation sensor device 10 of FIG. 1. Radiation sensitive cell 12C has some similarities with and some differences from radiation sensitive cell 12B of FIG. 2. As with radiation sensitive cell 12B of FIG. 2, radiation sensitive cell 12C may include or be a single-polysilicon Electrically Erasable Programmable Read Only Memory (EEPROM) cell formed as part of a CMOS integrated circuit. In this example, radiation sensitive cell 12C includes a floating gate 48, charging terminals 34 and 36, a ground terminal 16, and a cell output terminal 20. Radiation sensitive cell 12C may also include a metal oxide semiconductor (MOS) tunneling capacitor 42, a MOS control capacitor 44, and a MOS floating gate transistor 46.

Floating gate transistor 46 includes a metal oxide semiconductor field effect transistor (MOSFET), illustratively depicted as an N-channel transistor in this example, and which may be a P-channel transistor in other examples. Radiation sensitive cell 12C may be formed using a polysilicon deposition process to form a single polysilicon layer for the control capacitor 44, the tunneling capacitor 42, and the floating gate transistor 46. Ground terminal 16 and cell output terminal 20 are connected to the MOSFET transistor of floating gate transistor 46.

Radiation sensitive cell 12C also includes a cell charging circuit 33. One way in which radiation sensitive cell 12C differs from radiation sensitive cell 12B is that radiation sensitive cell 12C in the example of FIG. 3 does not include a photodiode bank. In radiation sensitive cell 12C, charging terminals 34 and 36 are connected between cell charging circuit 33, control capacitor 44, and tunneling capacitor 42.

Cell charging circuit 33 is configured to deliver voltage across charging terminals 34 and 36 based on a source voltage, which may be the same source voltage to which voltage source terminal 18 is connected in radiation sensor device 10 of FIG. 1, for example.

Cell charging circuit 33 thereby configures charging terminal 34 to deliver charge from cell charging circuit 33 to tunneling capacitor 42, and configures charging terminal 36 to deliver charge from cell charging circuit 33 to control capacitor 44. Cell charging circuit 33 may thereby charge up tunneling capacitor 42 and control capacitor 44, and thereby cause electrons to tunnel from a conduction band of tunneling capacitor 42, through insulating layer 50, such as an oxide layer, into floating gate 48. Once cell charging circuit 33 charges tunneling capacitor 42 and control capacitor 44 to a certain level, it causes a certain level of charge to be deposited on floating gate 48 in the form of the electrons tunneled to floating gate 48 from tunneling capacitor 42.

The electrons remain on floating gate 48 after cell charging circuit 33 no longer provides a charge to tunneling capacitor 42. The charge on floating gate 48 also controls the state of floating gate transistor 46, in particular, by setting floating gate transistor 46 to a relatively low resistance, in this example. This resistance may be an initial resistance to which radiation sensitive cell 12C is initially set. Floating gate 48 may thereby be configured to be charged via tunneling capacitor 42, and radiation sensitive cell 12C may be set to the initial resistance when floating gate 48 is charged to the initial charge.

While the examples above for FIGS. 2 and 3 are discussed at times in terms of electrons being tunneled to floating gate 48, other examples may refer to charge carriers in general, so that cell charging circuit 33 may charge tunneling capacitor 42 with either a negative or positive charge, and tunneling capacitor 42 may donate either electrons or electrons holes to tunnel to floating gate 48.

Floating gate 48 may be configured such that the electrons (in this example) on floating gate 48 may be susceptible to be discharged by one or more forms of radiation 11 incident on floating gate 48. This selection of the particular portion of a radiation-sensitive cell to use as its radiation-sensitive area is an area of difference between the examples of FIGS. 2 and 3. In the example of FIG. 2, photodiode bank 32 is exposed to potential incident radiation and forms the radiation-sensitive area of radiation-sensitive cell 12B while floating gate 48 may be shielded or protected from incident radiation; while in FIG. 3, floating gate 48 itself is exposed to potential incident radiation 11 and forms the radiation-sensitive area of radiation-sensitive cell 12C.

As in the discussion above with reference to FIG. 2, the description of FIG. 3 refers at times to incident radiation 11 with the understanding that this refers to a particular type of radiation to which radiation sensitive cell 12C is sensitive, and that qualifies for stimulating a response in radiation sensitive cell 12C. For the description of incident radiation 11 discharging electrons from floating gate 48, this refers to incident radiation 11 of a specific type or energy range to which radiation sensitive cell 12C is configured to respond.

When incident radiation 11 strikes floating gate 48, it may discharge electrons on floating gate 48, which may propagate to the conduction band of tunneling capacitor 42. Floating gate 48 may be configured such that incident radiation 11 discharges electrons from floating gate 48 at a precisely understood rate, probability, or relation. Floating gate 48 may be configured such that each quantum of incident radiation 11 of sufficient energy discharges one electron from floating gate 48, or has some other precisely defined probability of discharging one electron from floating gate 48.

As additional radiation 11 strikes floating gate 48 over time, additional electrons discharge from floating gate 48. The probability for a given quantum of incident radiation 11 to dislodge an electron from floating gate 48 may vary over time, such as by decreasing as the charge density on floating gate 48 decreases, for example. This variation in the relation between the cumulative amount of incident radiation 11 over time and the remaining charge on floating gate 48 may be taken into account in the configuration of radiation sensitive cell 12C or of a radiation sensor device of which radiation sensitive cell 12C forms a part. In various examples, the amount of charge remaining on floating gate 48 may therefore be a precisely understood representation for the amount of incident radiation 11 that has struck floating gate 48 over time. Floating gate 48 may therefore be configured to be discharged in response to incident radiation 11, wherein radiation sensitive cell 12C varies in resistance as a function of floating gate 48 being discharged in response to the incident radiation 11.

Floating gate transistor 46 of radiation sensitive cell 12C may be configured to apply a resistance between the ground terminal 16 and the cell output terminal 20. In this particular example, once cell charging circuit 33 charges the radiation sensitive cell 12C, and in particular floating gate 48, to its initial charge, floating gate transistor 46 may apply an initial gate voltage that is relatively low between ground terminal 16 and cell output terminal 20. Floating gate transistor 46 thereby also applies an initial resistance, which may also be a relatively low resistance, between ground terminal 16 and cell output terminal 20.

Floating gate transistor 46 may then apply a resistance between ground terminal 16 and cell output terminal 20 that increases as the charge on floating gate 48 decreases from its initial charge, as floating gate 48 is struck by incident radiation 11. Radiation sensitive cell 12C may therefore be configured to apply a resistance between the ground terminal 16 and the cell output terminal 20 that varies in cumulative response to radiation incident to the floating gate 48 and discharging the floating gate 48, in this example.

Various implementations of radiation sensor device 10 of FIG. 1 may use radiation sensitive cell 12B of FIG. 2 or radiation sensitive cell 12C of FIG. 3 as its radiation sensitive cell 12 as in FIG. 1. In these examples, as in the examples discussed above with reference to FIG. 1, the cell output terminal 20 may have a voltage that varies in response to the varying of the resistance applied by the radiation sensitive cell 12B as in FIG. 2 or the radiation sensitive cell 12C as in FIG. 3 between the ground terminal 16 and the cell output terminal 20. Radiation sensitive cell 12B or radiation sensitive cell 12C may therefore function as part of radiation sensor device 10 of FIG. 1 to vary the voltage of cell output terminal 20, thereby altering the period of time for the voltage of cell output terminal 20 to reach the threshold voltage on second input terminal 22, and thereby altering the oscillation rate of oscillator 13. Either radiation sensitive cell 12B of FIG. 2 or radiation sensitive cell 12C of FIG. 3 may therefore be used as the radiation sensitive cell 12 in radiation sensor device 10 of FIG. 1 to provide an easy-to-measure indication of incident radiation 11 that has struck radiation sensitive cell 12.

In various examples, radiation sensitive cell 12C of FIG. 3 may experience no electron tunneling or other effects that induce any changes in the resistance it applies other than the cumulative dose of radiation of the selected type or range.

This may be ensured by providing the insulating layer 50, which may be implemented as an oxide layer, with a sufficient thickness to ensure that potential random, unprompted electron tunneling from floating gate 48 back to the conduction band of tunneling capacitor 42, i.e., electron tunneling in the absence of incident radiation, is kept to a negligible rate. Growing the oxide layer to a sufficient thickness for this purpose may be done within the scope of standard CMOS manufacturing processes and not require custom CMOS processes, in various examples.

While floating gate transistor 46 is implemented as an NMOS transistor in the example of FIG. 3, various examples may also use a PMOS transistor. In these examples, the radiation sensitive cell may begin at a high initial resistance and the cell output may begin at a high initial voltage, and the cell resistance and cell output voltage may decrease cumulatively as a function of the radiation to which the floating gate 48 of radiation sensitive cell 12C is exposed.

Figure 4:
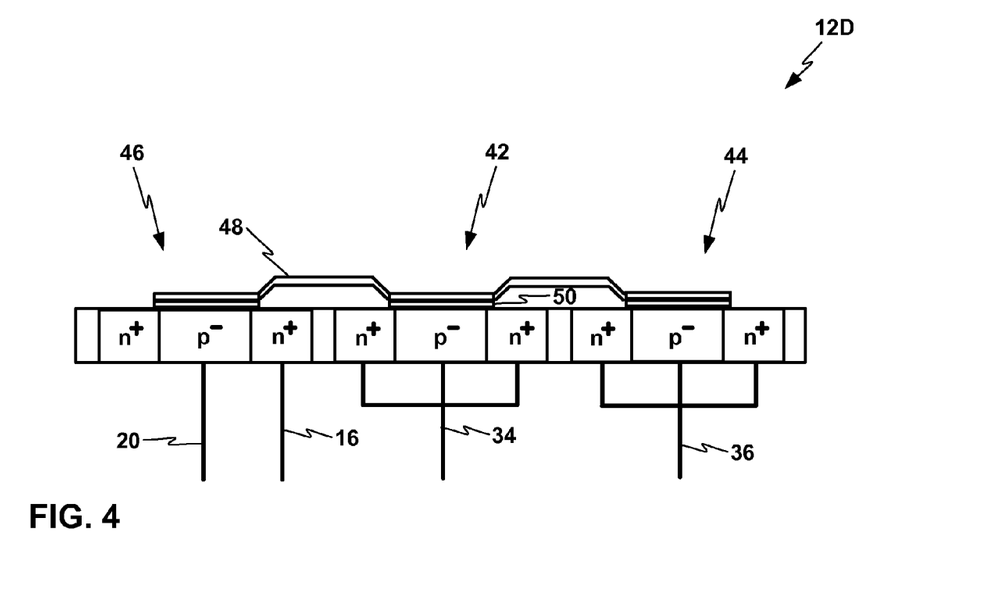
FIG. 4 is a schematic diagram of an illustrative example of a radiation sensitive cell that may be part of a radiation sensor device of this disclosure.

FIG. 4 is a schematic diagram of an illustrative example of a radiation sensitive cell 12D that may be part of a radiation sensor device of this disclosure, such as radiation sensor device 10 of FIG. 1. While FIG. 4 shows additional physical detail, radiation sensitive cell 12D of FIG. 4 may be an implementation of part of either radiation sensitive cell 12B of FIG. 2 or radiation sensitive cell 12C of FIG. 3, and all reference numbers in FIG. 4 in common with FIGS. 2 and 3 indicate the corresponding elements of the same reference numbers in FIGS. 2 and 3. As shown in FIG. 4, floating gate transistor 46, tunneling capacitor 42, and control capacitor 44 may all be formed from a single-polysilicon EEPROM cell, each formed with a p⁻ region surrounded by n⁺ regions. Radiation sensitive cell 12D may be formed with a single polysilicon layer. Radiation sensitive cell 12D may therefore be formed with a standard CMOS process, and may be manufactured without requiring any custom CMOS processes in various examples. Other examples may also include other arrangements of doped regions in the capacitors, including asymmetric capacitors, in which the tunneling capacitor 42 and the control capacitor 44 are formed with n⁺/p⁻/p⁺ doped regions, for example. Other examples may also include multiple control capacitors and/or multiple tunneling capacitors, for example.

Figure 5:
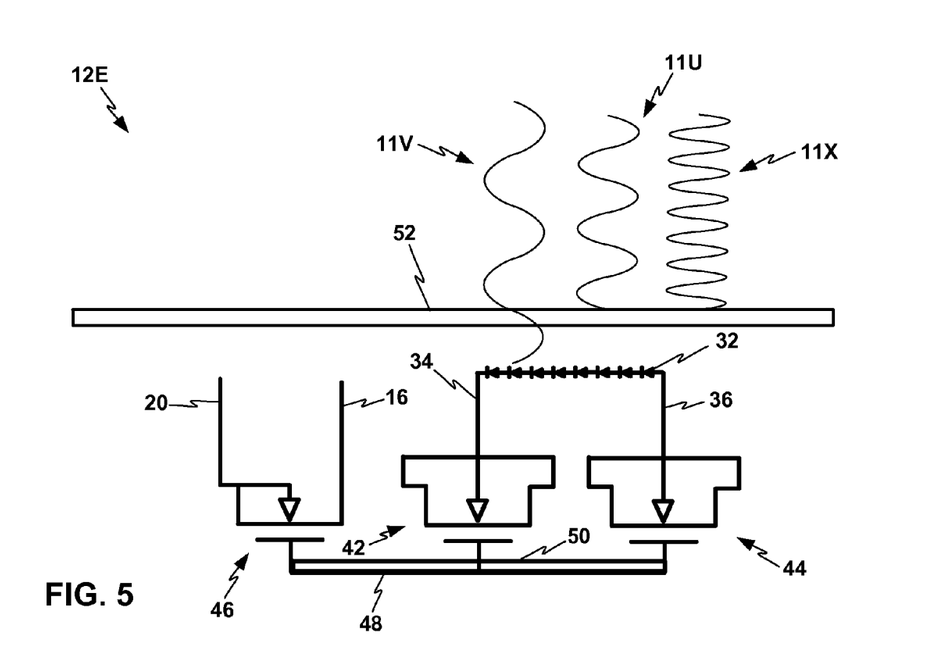
FIG. 5 is a circuit diagram of an illustrative example of a radiation sensitive cell that may be part of a radiation sensor device of this disclosure.

FIG. 5 is a circuit diagram of an illustrative example of a radiation sensitive cell 12E that may be part of a radiation sensor device of this disclosure, such as radiation sensor device 10 of FIG. 1. Radiation sensitive cell 12E of FIG. 5 is similar to radiation sensitive cell 12B of FIG. 2, and with all corresponding reference numbers in common with FIG. 2. Radiation sensitive cell 12E of FIG. 4 differs in that it also includes a frequency-selective shield 52 positioned over photodiode bank 32. Frequency-selective shield 52 may be implemented as a filter, a reflective coating, a grid, any combination of the above, or any other implementation. Frequency-selective shield 52 is one way in which a radiation sensitive cell of this disclosure may be tailored to be sensitive and responsive only to certain kinds of radiation, and not sensitive to other kinds, so that the radiation sensitive cell provides a voltage response for charging a floating gate or otherwise varying an output voltage in response to selected or qualified types of radiation, and not to other types.

For example, radiation sensitive cell 12E may alternately be exposed to visible light radiation 11V, soft ultraviolet radiation 11U, and hard ultraviolet radiation 11X, at various times or at the same time. As shown in the example of FIG. 5, the particular frequency-selective shield 52 used in radiation sensitive cell 12E is opaque to soft ultraviolet radiation 11U and hard ultraviolet radiation 11X, but is transparent to visible light radiation 11V. This particular configuration of radiation sensitive cell 12E may be included in a radiation sensor device for which it is desired to track any exposure of the radiation sensor device to visible light, and to prevent any soft ultraviolet light or hard ultraviolet radiation from interfering with the tracking of any incident visible light. It may also be desired to track infrared light, and frequency-selective shield 52 may be configured to be transparent to both infrared radiation and visible light but opaque to soft ultraviolet light and hard ultraviolet radiation, for example.

For example, an engineer may desire to implement a radiation sensitive integrated circuit or other device. The engineer may design the integrated circuit to include radiation sensitive cell 12E, so that if the integrated circuit and in particular radiation sensitive cell 12E is exposed to any radiation in a targeted frequency range, this changes the resistance of radiation sensitive cell 12E. Even if the integrated circuit is unpowered, the resistance of radiation sensitive cell 12E is altered by any radiation in a targeted frequency range it is exposed to.

Once the integrated circuit is powered up, the oscillator starts delivering its output signal to counter 30 at an altered oscillation frequency due to the altered resistance of radiation sensitive cell 12E, and counter 30 may communicate the altered oscillation frequency to a controller of the integrated circuit. The controller may then react to this indication by performing actions appropriate to the application, such as to indicate whether or not a piece of medical equipment has been sufficiently sterilized, for example.

The designing engineer may intend for the integrated circuit to respond to exposure to some frequencies of radiation but not others, in accordance with various applications. Radiation-sensitive cell 12E with frequency-selective shield 52 may enable this capability.

Frequency-selective shield 52 may therefore prevent radiation incident on radiation sensitive cell 12E that is outside a frequency range of interest from intercepting photodiode bank 32 or having a chance to affect the charge carriers on photodiode bank 32. In other examples, photodiode bank 32 may be implemented with photodiodes that are inherently only responsive to a frequency range of interest, or a frequency-selective shield 52 is used together with photodiodes selected for particular frequency ranges of responsiveness to tailor the radiation sensitive cell 12E to the precise frequency ranges of interest.

In other examples, a variety of other means may be used for ensuring that photodiode bank 32 is only selectively exposed to incident radiation having frequencies or energy levels of interest, while photodiode bank 32 remains unaffected by other radiation. While the particular example of FIG. 4 depicts a frequency-selective shield 52 that is configured to block soft ultraviolet light and hard ultraviolet radiation but admit visible light, other examples may use means to admit or block any one or more portions of the electromagnetic spectrum and/or other forms of radiation, such as cosmic rays. In various examples, therefore, the resistance applied by radiation sensitive cell 12E between the ground terminal 16 and the cell output terminal 20 varies in cumulative response to radiation of a first frequency range incident to photodiode bank 32, and wherein radiation of a second frequency range does not induce a response in photodiode bank 32.

Figure 6:
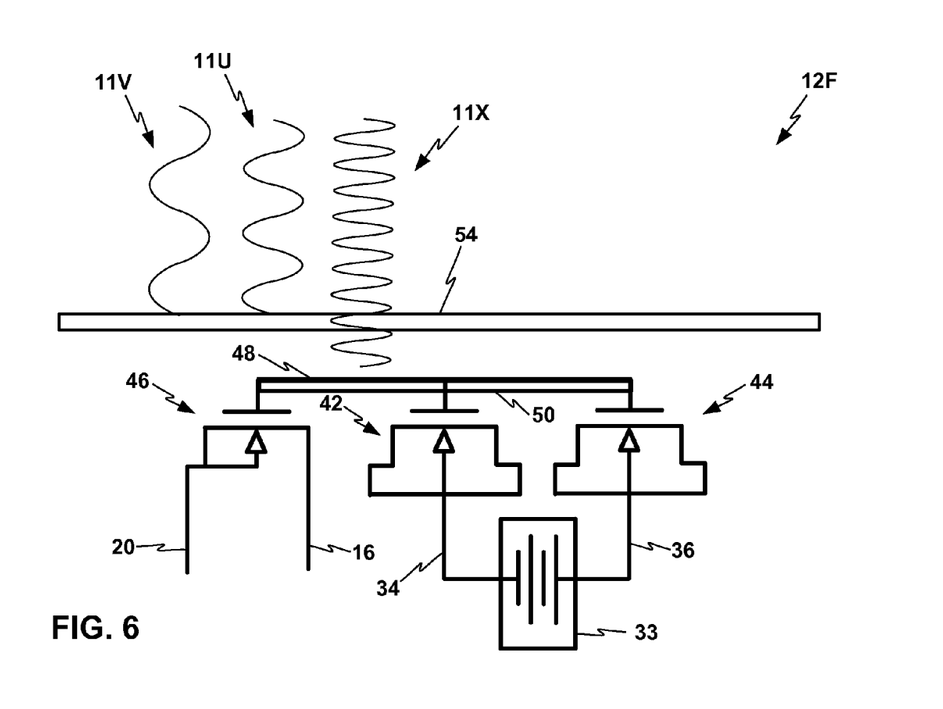
FIG. 6 is a circuit diagram of an illustrative example of a radiation sensitive cell that may be part of a radiation sensor device of this disclosure.

FIG. 6 is a circuit diagram of another illustrative example of a radiation sensitive cell 12F that may be part of a radiation sensor device of this disclosure, such as radiation sensor device 10 of FIG. 1. Radiation sensitive cell 12F of FIG. 6 is similar to radiation sensitive cell 12C of FIG. 3, and with all corresponding reference numbers in common with FIG. 3. Radiation sensitive cell 12F of FIG. 6 differs in that it also includes a frequency-selective filter 54 positioned over floating gate 48, where frequency-selective filter 54 has a different frequency response profile from frequency-selective filter 52 of FIG. 5, as detailed below.

Frequency-selective shield 54 may also be implemented as a filter, a reflective coating, a grid, any combination of the above, or any other implementation. Frequency-selective shield 54 is one way in which a radiation sensitive cell of this disclosure may be tailored to be sensitive and responsive only to certain kinds of radiation, and not sensitive to other kinds, so that the radiation sensitive cell provides a voltage response for charging a floating gate or otherwise varying an output voltage in response to selected or qualified types of radiation, and not to other types.

For example, radiation sensitive cell 12F may alternately be exposed to visible light radiation 11V, soft ultraviolet radiation 11U, and hard ultraviolet radiation 11X, at various times or at the same time. As shown in the example of FIG. 5, the particular frequency-selective shield 54 used in radiation sensitive cell 12F is opaque to visible light radiation 11V and soft ultraviolet radiation 11U, but is transparent to hard ultraviolet radiation 11X. This particular configuration of radiation sensitive cell 12F may be included in a radiation sensor device for which it is desired to track the cumulative exposure of the cumulative dose radiation sensor device to hard ultraviolet radiation. There may also be a particular portion of the hard ultraviolet frequency range that is targeted for measurement and that frequency-selective shield 54 is configured to admit selectively, such as UVC radiation for a germicidal application of approximately 100 to 280 nanometers in wavelength (i.e. an energy of approximately 4.4 to 12.4 eV), while blocking out the portion of the ultraviolet range that does not significantly contribute to the germicidal application, such as ultraviolet radiation of greater than 280 nanometers in wavelength, for example.

Frequency-selective shield 54 may therefore prevent radiation incident on radiation sensitive cell 12F that is outside a frequency range of interest from intercepting floating gate 48 or having a chance to affect the charge carriers on floating gate 48. In other examples, a variety of other means may be used for ensuring that floating gate 48 is only selectively discharged by incident radiation having frequencies or energy levels of interest, while floating gate 48 remains unaffected by other radiation. While the particular example of FIG. 6 depicts a frequency-selective shield 54 that is configured to block visible and soft ultraviolet light but admit hard ultraviolet radiation, other examples may use means to admit or block any one or more portions of the electromagnetic spectrum and/or other forms of radiation, such as cosmic rays. In various examples, therefore, the resistance applied by radiation sensitive cell 12F between the ground terminal 16 and the cell output terminal 20 varies in cumulative response to radiation of a first frequency range discharging the floating gate 48, and wherein radiation of a second frequency range does not discharge the floating gate 48.

A similar effect may be implemented in the floating gate 48 itself, such that floating gate 48 is inherently only responsive to incident radiation of certain frequency ranges, and only discharges electrons when exposed to radiation of those certain frequency ranges, while not discharging electrons when exposed to radiation of other frequency ranges. For example, various implementations of floating gate 48 may discharge electrons when exposed to ultraviolet light, X-rays, gamma rays, or cosmic rays, but not when exposed to visible light. In other implementations, floating gate 48 may discharge electrons when exposed to visible light, ultraviolet light, X-rays, gamma rays, or cosmic rays, but not when exposed to infrared light, microwaves, or radio waves. Floating gate 48 may therefore be sensitive to a first frequency range of radiation and not be sensitive to a second frequency range of radiation, and radiation sensitive cell 12F may vary in resistance between the ground terminal 16 and the output terminal 20 in cumulative response only to radiation in the first frequency range discharging the floating gate 48.

While a frequency-selective shield 52 that admits visible light and blocks soft ultraviolet light and hard ultraviolet radiation is used in combination with a radiation-sensitive cell 12E based on a photodiode bank 32 in the example of FIG. 5 and a frequency-selective shield 54 that admits hard ultraviolet radiation and blocks visible light and soft ultraviolet light is used in combination with a radiation-sensitive cell 12F based on exposure of the floating gate 48 to the incident radiation in the example of FIG. 6, the opposite combination may also be used in other examples, and any combination of any type of frequency-selective shield with any type of underlying structure for the radiation-sensitive area of the radiation-sensitive cell may also be used in other examples.

For instance, in yet another example, a designing engineer may want to embed an integrated circuit in a medical device, a medicine packaging, or a food safety device that is intended to be exposed to a certain threshold dose of ultraviolet radiation to ensure that it is sterilized, before a medical device is implanted in a human body, or before medicine in the medicine packaging is administered to a patient, or before food packaged with the food safety device is provided for human consumption. In another example, a radiation-sensitive cell analogous in some ways to radiation-sensitive cells 12E or 12F may be tailored to be sensitive only to ultraviolet radiation, and specifically to a narrower section of the ultraviolet spectrum intended for the specific use case, and not to any radiation of higher or lower energies, thereby preventing any interference by any other type of radiation. A radiation sensor device incorporating this ultraviolet-only radiation-sensitive cell may be configured to measure a dose of ultraviolet light, and signal once it has been exposed to a selected amount of ultraviolet light, indicating that the medical device, medicine packaging, or food safety device has been exposed to sufficient ultraviolet radiation to sterilize it and render it safe to proceed, in these examples.

Additionally, a radiation sensor device may include multiple different kinds of radiation-sensitive cells together in the same device, including any combination of radiation-sensitive cells 12B, 12C, 12E, 12F, and the other variations indicated above, to track any of various different frequency ranges independently.

Figure 7:
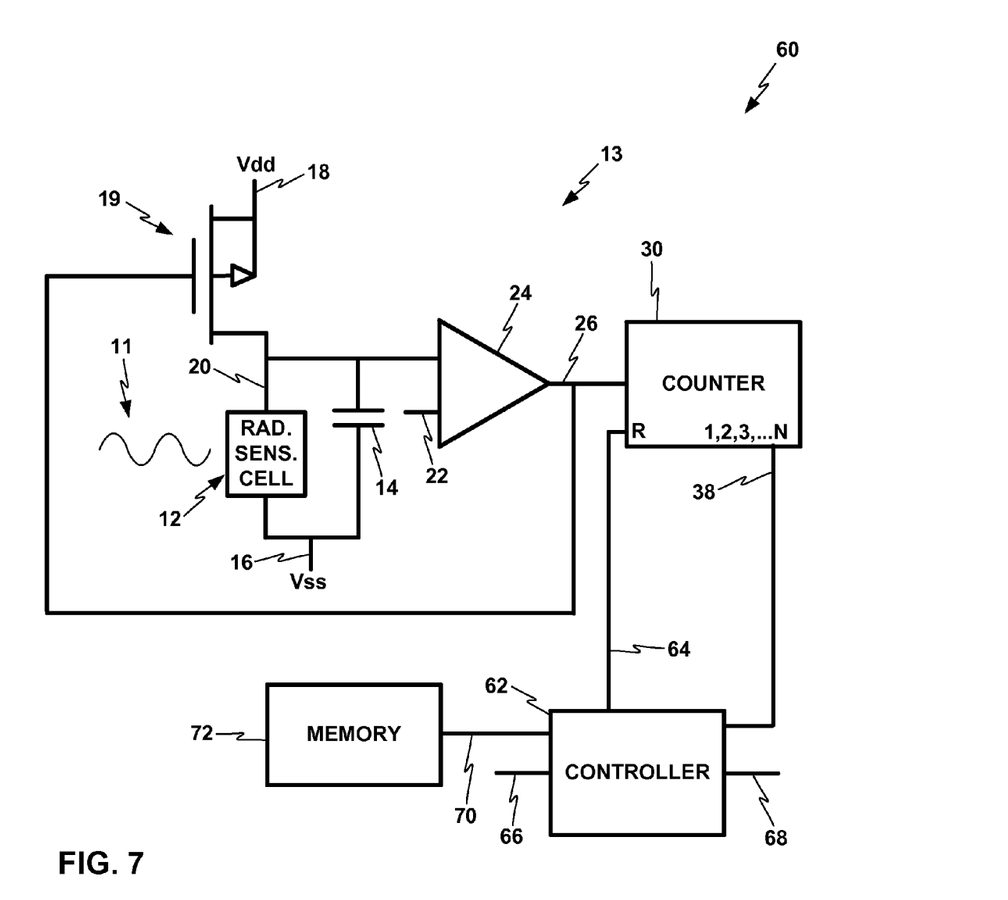
FIG. 7 is a circuit diagram of an illustrative example of a radiation sensor device of this disclosure.

FIG. 7 is a circuit diagram of an illustrative example of a radiation sensor device 60 of this disclosure. Radiation sensor device 60 of FIG. 7 is similar in many of its elements to radiation sensor device 10 of FIG. 1, and all the reference numbers shared in common between FIGS. 1 and 7 refer to the identical elements in FIG. 7. Radiation sensor device 60 of FIG. 7 may also incorporate any of the example radiation sensitive cells 12B, 12C, 12D, 12E, and 12F of FIGS. 2-6 for its radiation sensitive cell 12. Radiation sensor device 60 of FIG. 7 differs in that it also includes a controller 62 and a memory component 72, with various connections among these components and the other elements of cumulative dose radiation sensor device 60. Controller 62, memory component 72, and the rest of cumulative dose radiation sensor device 60 may all form part or all of an integrated circuit, for example. The integrated circuit may also include any of a number of other components, potentially including additional memory components, for example.

Controller 62 is connected to a counter output 38 of the counter 30, wherein the controller is configured to receive an output of the count maintained by counter 30. Controller 62 is therefore configured to measure the oscillation frequency of oscillator 13. Controller 62 may also have the recorded initial oscillation frequency of oscillator 13 in its storage or in memory accessible to it, such as in memory component 72. Controller 62 is further configured to execute a selected action in response to the oscillation frequency indicated by the counter 30 being different from the recorded initial oscillation frequency. Controller 62 may also require that the difference between the currently measured oscillation frequency and the recorded initial oscillation frequency differ by at least a selected threshold, to ensure that it is not too sensitive and does not react on a false positive.

The selected action taken by controller 62 in response to the current oscillation frequency being different from the recorded initial oscillation frequency may include at least one action selected from among a group of potential actions. For example, the action or actions performed by controller 62 may include providing a signal, such as via an RF transmitter, to other elements outside of the integrated circuit of which cumulative dose radiation sensor device 60 forms a part, for those other elements also to initiate a user-defined function. Controller 62 may also provide a signal indicating whether or not the integrated circuit has been exposed to more than a selected cumulative dose of radiation. This may include causing other elements of the integrated circuit to provide a signal from the integrated circuit to other elements of a communication system, computing system, and/or other electronic system, to communicate the information of how much cumulative dose of the selected type or frequency range of radiation to which cumulative dose radiation sensor device 60 has been exposed.

Controller 62 also has a connection 64 to a reset input of counter 30, and is thereby configured to reset the count maintained by counter 30, such as to 0. This may be a desirable option once the oscillation frequency has been measured, such that controller 62 prepares the counter 30 to make another measurement of the oscillation frequency of oscillator 13 at some point in the future. Controller 62 also has system input connections 66 and system output connections 68 on which it receives and sends data to the rest of an integrated circuit of which cumulative dose radiation sensor device 60 may form a part. For example, controller 62 may send a signal to another part of the integrated circuit, or to a larger system, via system output connections 68, in response to the current oscillation frequency being different from the recorded initial oscillation frequency, or a subsequent reset of the initial oscillation frequency, by at least a selected threshold difference, if any.

Figure 8:
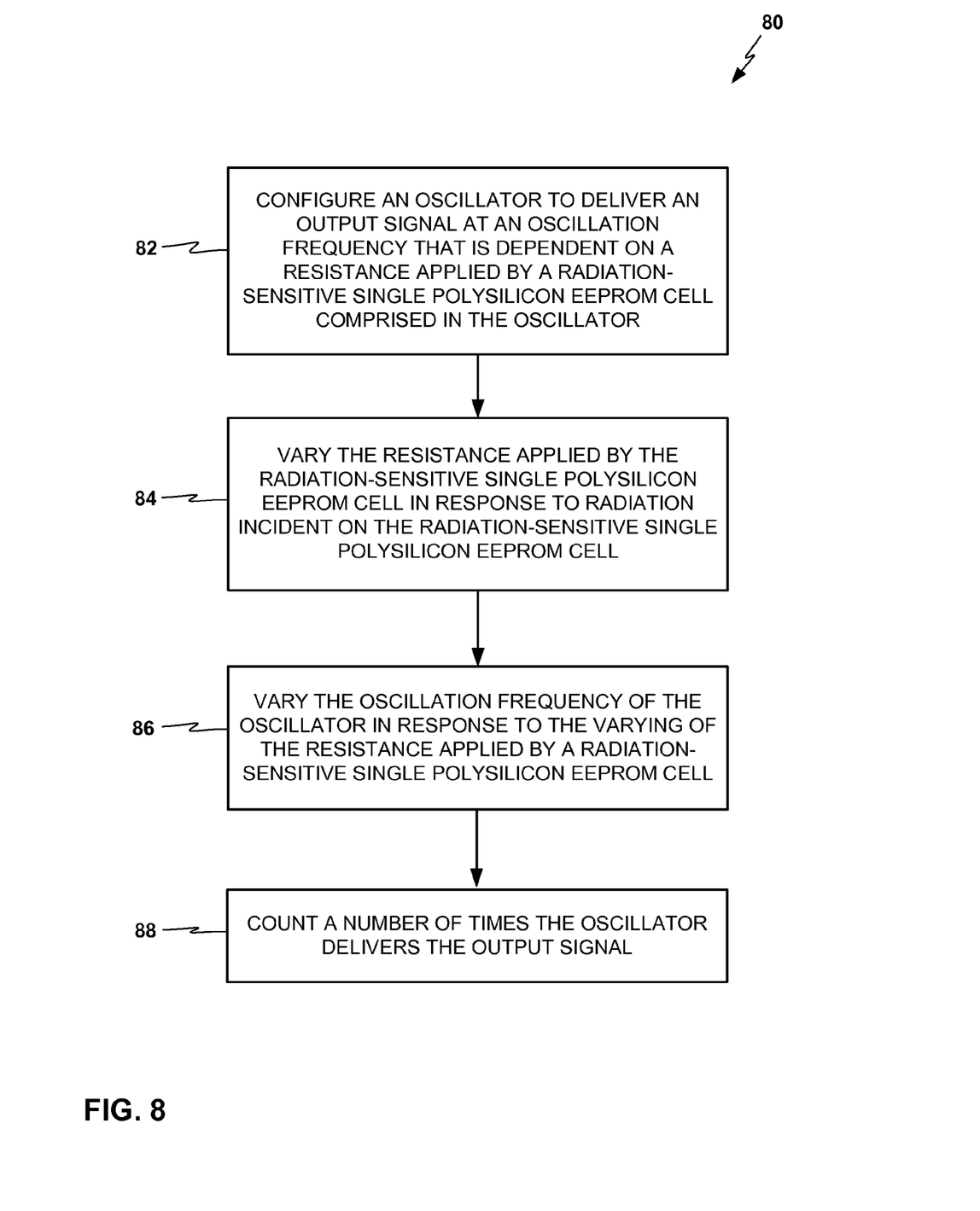
FIG. 8 is a flowchart of an illustrative example of a process for sensing radiation with a radiation sensor device of this disclosure.

FIG. 8 is a flowchart of an illustrative example of a process 80 for sensing radiation with a radiation sensor device of this disclosure, such as radiation sensor devices 10 or 60 of FIGS. 1 and 7. Process 80 may be performed by, implemented in, or embodied in a device configured for carrying out process 80 or portions thereof, which may include any of the devices depicted in FIGS. 1-7 and described above with reference thereto. Reference numerals from FIGS. 1-7 are also used below to indicate representative examples of how various elements of process 80 may relate to the devices of FIGS. 1-7.

In process 80, a device may configure an oscillator, such as oscillator 13 of FIG. 1 or 7, to deliver an output signal at an oscillation frequency that is dependent on a resistance applied by a radiation-sensitive single polysilicon EEPROM cell, such as any of radiation-sensitive cells 12, 12B, 12C, 12D, 12E, or 12F of FIGS. 1-7, comprised in the oscillator 13 (82). The device may vary the resistance applied by the radiation-sensitive single polysilicon EEPROM cell, such as any of radiation-sensitive cells 12, 12B, 12C, 12D, 12E, or 12F, in response to radiation incident on the radiation-sensitive single polysilicon EEPROM cell (84). The device may vary the oscillation frequency of the oscillator 13 in response to the varying of the resistance applied by a radiation-sensitive single polysilicon EEPROM cell (86). The device may then count, such as with counter 30 of FIGS. 1 and 7, a number of times the oscillator delivers 13 the output signal, such as via the comparator output terminal 26 (88).

The techniques described herein may be able to produce integrated circuits that implement logic using a CMOS process technology. The circuit components described in this disclosure can be implemented as discrete components, as one or more elements of one or more integrated devices, or any combination thereof. The circuit components described herein may be fabricated using any of a wide variety of process technologies including CMOS process technologies, including either standard or custom CMOS process technologies. In addition, the circuitry described herein may be used in various applications including telecommunications applications, general computing application, or any application that may make use of an integrated radiation sensor.

Various aspects of the disclosure have been described. These and other aspects are within the scope of the following claims.

The invention claimed is:

1. A device comprising:
   an oscillator comprising a radiation-sensitive cell and a comparator, wherein the radiation-sensitive cell is configured to apply a resistance, and the comparator is configured to receive an input signal based at least in part on the resistance applied by the radiation-sensitive cell, and to deliver an output signal via an oscillator output terminal at intervals defined by an oscillation frequency; and
   a counter, connected to the oscillator output terminal and configured to count a number of times the comparator delivers the output signal from the oscillator;
   wherein the resistance applied by the radiation-sensitive cell is configured to vary in response to incident radiation, and the oscillator is configured for the oscillation frequency to vary based at least in part on the resistance of the radiation-sensitive cell;
   wherein the radiation-sensitive cell comprises a single-polysilicon EEPROM cell formed with a standard CMOS process, wherein the single-polysilicon EEPROM cell comprises a control capacitor, a tunneling capacitor, a floating gate transistor, and a floating gate positioned between the tunneling capacitor and the floating gate transistor.

2. The device of claim 1, wherein the radiation-sensitive cell comprises one or more photodiodes, and the floating gate is configured to be charged via the one or more photodiodes.

3. The device of claim 2, wherein the one or more photodiodes comprises a plurality of photodiodes in series.

4. The device of claim 3, wherein the plurality of photodiodes in series comprises between sixteen and thirty-four photodiodes.

5. The device of claim 1, further comprising a controller connected to an output of the counter, wherein the controller is configured to compare the output of the counter to an expectation value of the output of the counter at a given point in time.

6. The device of claim 5, wherein the controller is further configured to perform a selected action in response to the output from the counter varying from the expectation value by more than a selected threshold difference.

7. The device of claim 6, wherein the selected action the controller is configured to perform in response to the output from the counter varying from the expectation value by more than the selected threshold difference comprises signaling that the output from the counter is varying from the expectation value by more than the selected threshold difference.

8. The device of claim 1, wherein the floating gate is configured to be discharged in response to incident radiation, wherein the radiation-sensitive cell varies in resistance as a function of the floating gate being discharged in response to the incident radiation.

9. An integrated circuit comprising:
an EEPROM cell comprising a ground terminal, a cell output terminal, and a floating gate, wherein the floating gate is configured to control a resistance between the ground terminal and the cell output terminal, wherein the EEPROM cell is configured to vary the resistance between the ground terminal and the cell output terminal in response to radiation incident on the EEPROM cell, and thereby vary the voltage of the cell output terminal in response to radiation incident on the EEPROM cell;
a MOSFET transistor connected between the cell output terminal and a voltage source terminal;
a capacitor connected between the ground terminal and the cell output terminal in parallel with the EEPROM cell;
a comparator comprising a first input terminal, a second input terminal, and a comparator output terminal, wherein the first input terminal is connected to the cell output terminal and the second input terminal is connected to a threshold voltage, wherein the comparator is configured to deliver an output signal via the comparator output terminal in response to the voltage of the cell output terminal reaching the threshold voltage; and
a counter connected to the comparator output terminal and configured to count a number of times the comparator delivers the output signal;
wherein the MOSFET transistor comprises a gate terminal that is connected to the comparator output terminal and configured to vary the resistance between the voltage source and the cell output terminal in response to the output signal from the comparator.

10. The integrated circuit of claim 9, wherein the radiation-sensitive cell comprises a plurality of series-connected photodiodes, and the floating gate is configured to be charged via the plurality of series-connected photodiodes.

11. The integrated circuit of claim 10, wherein the floating gate comprises a floating gate transistor and wherein the EEPROM cell further comprises:
a tunneling capacitor; and
a control capacitor,
wherein the floating gate transistor, the tunneling capacitor, and the control capacitor are formed from a single polysilicon insulating layer;
wherein the plurality of series-connected photodiodes are connected to the tunneling capacitor and the control capacitor via charging terminals and configured to charge the floating gate by charge carrier tunneling through the polysilicon insulating layer from the tunneling capacitor in response to radiation incident on the plurality of series-connected photodiodes; and
wherein the EEPROM cell is configured to increase the resistance between the ground terminal and the cell output terminal from an initial resistance to a higher resistance in response to radiation incident on the plurality of series-connected photodiodes.

12. The integrated circuit of claim 9, further comprising a frequency-selective shield positioned over the EEPROM cell, wherein the EEPROM cell is configured to vary the resistance between the ground terminal and the cell output terminal in response to radiation of a first frequency range incident on the EEPROM cell, and the EEPROM cell is configured not to vary the resistance between the ground terminal and the cell output terminal in response to radiation of a second frequency range incident on the EEPROM cell.

13. The integrated circuit of claim 9, further comprising:
a cell charging circuit connected to the EEPROM cell and configured to charge the floating gate to an initial charge at which the floating gate applies an initial resistance between the ground terminal and the cell output terminal;
wherein the EEPROM cell is configured to decrease the resistance between the ground terminal and the cell output terminal from the initial resistance to a lower resistance in response to radiation incident on the floating gate.

14. The integrated circuit of claim 13, wherein the floating gate comprises a floating gate transistor and wherein the EEPROM cell further comprises:
a tunneling capacitor; and
a control capacitor,
wherein the floating gate transistor, the tunneling capacitor, and the control capacitor are formed from a single polysilicon EEPROM layer; and
wherein the cell charging circuit is connected to the tunneling capacitor and the control capacitor via charging terminals, and the EEPROM cell is configured for the floating gate to be charged by charge carrier tunneling through an insulating layer from the tunneling capacitor in response to the cell charging circuit charging the tunneling capacitor.

* * * * *